United States Patent [19]

Harzer

[11] 4,191,930
[45] Mar. 4, 1980

[54] DIGITALLY SETTABLE FREQUENCY GENERATOR

[75] Inventor: Peter Harzer, Eningen, Fed. Rep. of Germany

[73] Assignee: Wandel u. Goltermann GmbH & Co., Eningen, Fed. Rep. of Germany

[21] Appl. No.: 941,955

[22] Filed: Sep. 13, 1978

[30] Foreign Application Priority Data

Sep. 14, 1977 [DE] Fed. Rep. of Germany ....... 2741351

[51] Int. Cl.² .............................................. H03B 3/06
[52] U.S. Cl. ........................................ 331/1 A; 331/2; 331/25
[58] Field of Search ....................... 331/2, 18, 46, 1 A, 331/25; 328/14

[56] References Cited

U.S. PATENT DOCUMENTS

| 3,453,542 | 7/1969 | Hoffman | 328/14 X |
| 4,023,108 | 5/1977 | Torii | 331/1 A X |

FOREIGN PATENT DOCUMENTS 1301840  1/1973  United Kingdom ....................... 331/2

Primary Examiner—Siegfried H. Grimm
Assistant Examiner—Edward P. Westin
Attorney, Agent, or Firm—Karl F. Ross

[57] ABSTRACT

A frequency generator of the digitally settable type comprises several voltage-controlled oscillators, specifically a pair of pilot oscillators and a final oscillator, provided with respective phase-locking loops each including a phase discriminator. The loops of the pilot oscillators further include respective frequency dividers whose step-down ratios are controlled by setting commands stored in associated memories which can be reloaded, under the control of manually or automatically adjustable selectors, only in the presence of an enabling pulse generated by a coincidence circuit with inputs connected to the outputs of a source of reference frequency and of the several stages of a chain of binary dividers connected to that source, certain of these stage outputs delivering comparison frequencies to the phase discriminators fed by the frequency dividers of the pilot oscillators. The phase discriminator associated with the final oscillator has one input connected to a mixer and another input connected to one of the pilot oscillators, the mixer receiving operating frequencies of the other pilot oscillator and of the final oscillator. A timing device such as a monoflop may be triggered by the enabling pulses for temporarily disabling the final phase discriminator, or restricting its dynamic range, to suppress fluctuations in the output frequency due to transient oscillator instability. The emission of such inhibiting pulses may be limited to switching operations involving both pilot oscillators, as upon the occurrence of a denominational carry.

10 Claims, 5 Drawing Figures

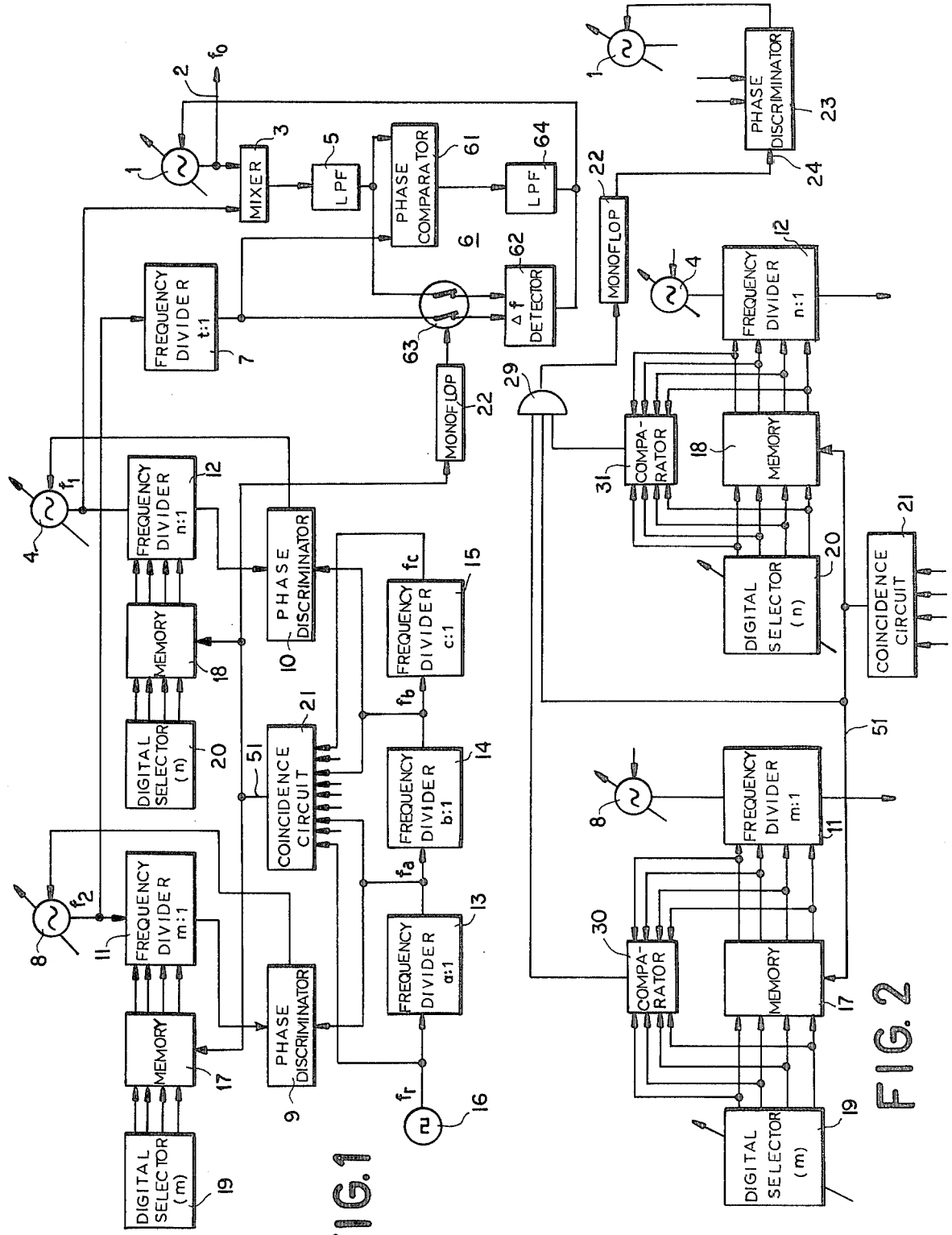

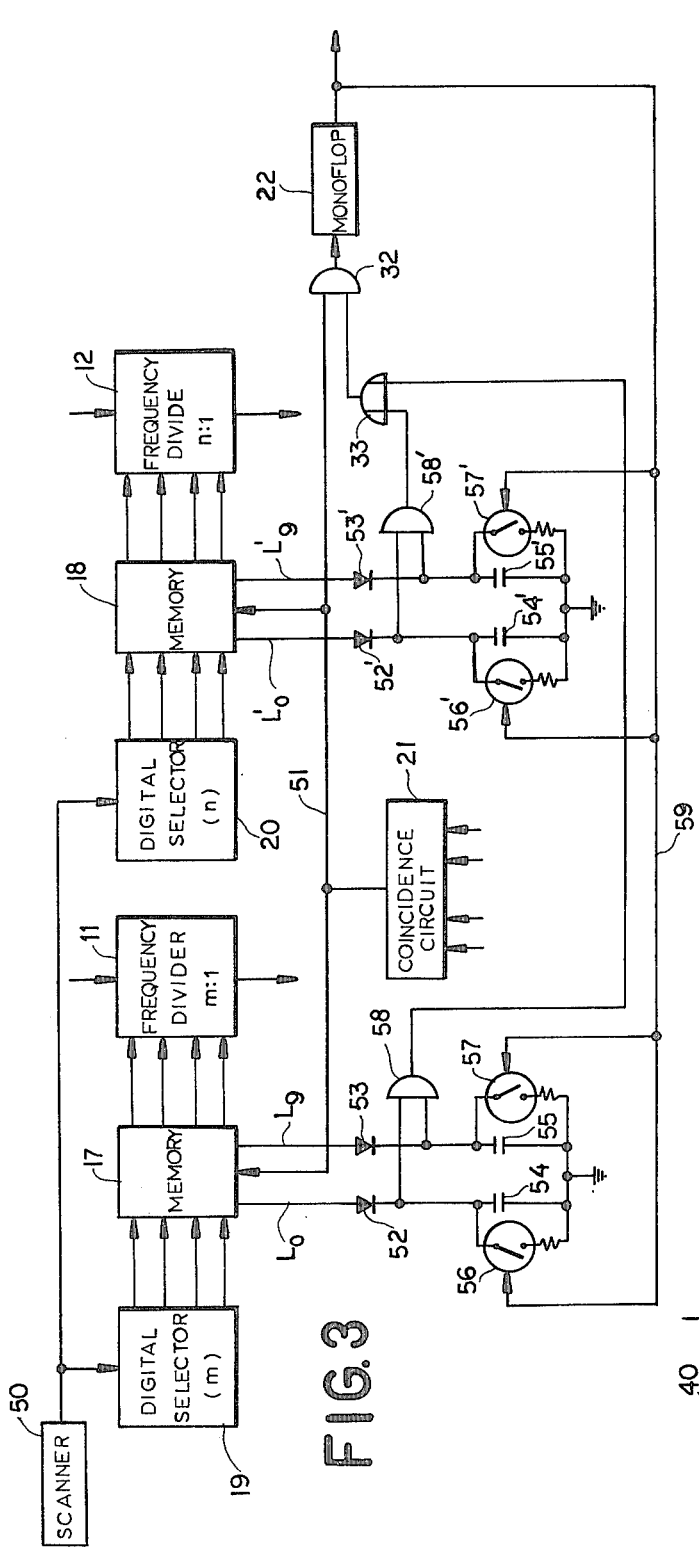
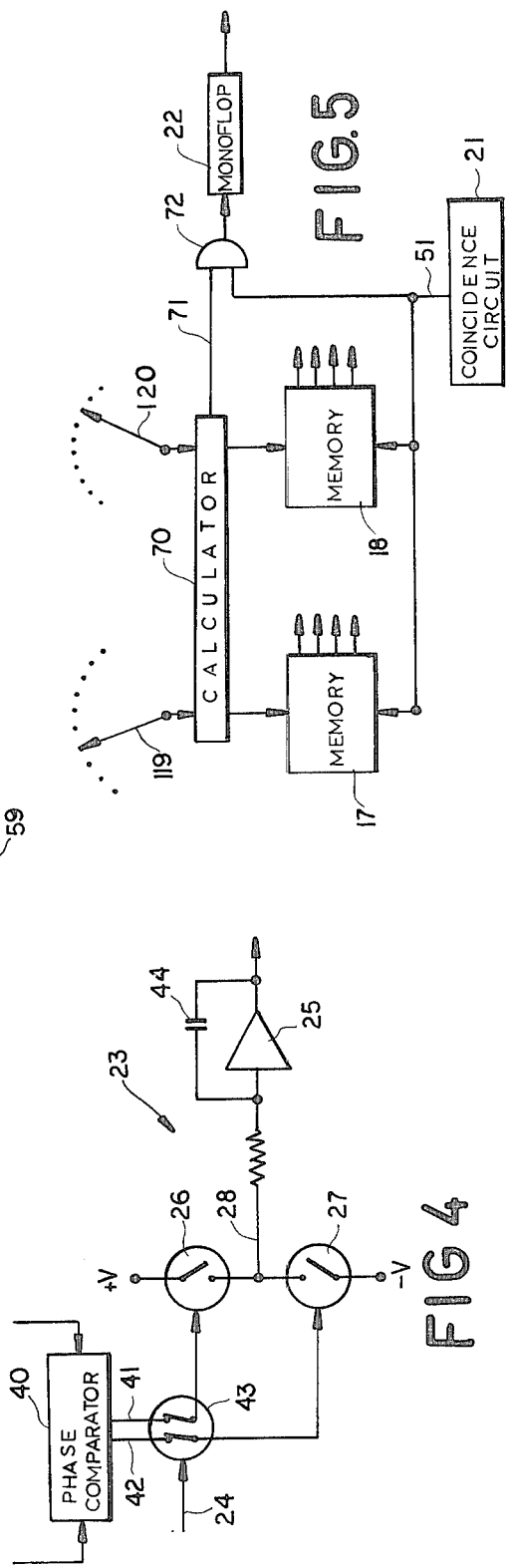

DIGITALLY SETTABLE FREQUENCY GENERATOR

FIELD OF THE INVENTION

My present invention relates to a digitally settable frequency generator producing an output oscillation whose frequency may be varied in discrete steps, either manually or under the control of a scanner.

BACKGROUND OF THE INVENTION

A frequency generator of this type has been disclosed, for example, in commonly owned U.S. Pat. No. 3,453,542 to Gunther Hoffmann. Such a generator comprises a number of cascaded denominational (e.g. decadic) switching stages each including a phase-locked oscillator whose control loop includes a phase discriminator receiving a comparison or reference frequency from a source outside that stage. The operating frequency of the oscillator is fed to the associated phase discriminator through a step-down device which may be a selectively adjustable frequency divider or a mixer also receiving a heterodyning frequency. Thus, the oscillator output is stabilized at a frequency which, when modified in the step-down device, matches exactly the comparison frequency supplied to the phase discriminator.

As further described in Hoffmann U.S. Pat. No. 3,453,542, the phase discriminator may be connected in parallel with a frequency-difference detector which goes into action whenever the supplied comparison frequency differs from the stepped-down oscillator frequency by a value greater than that which can be conveniently handled by the associated phase discriminator.

Such a situation occurs, for example, upon the appearance of a denominational carry, i.e. on a changeover from "9" to "0" or vice versa in a decimal system. The large readjustment of the oscillator in this situation results in a brief period of instability which may be acceptable if the resetting involves only one oscillator but which could lead to significant disturbances or even possible malfunctions if it affects two or more oscillators interacting with one another. Thus, a change from 999 to 1000 Hz in a decadic frequency generator, though representing only a small increment, would require large frequency jumps for the oscillators in three of the four cascaded generator stages participating in this operation.

The aforesaid inconveniences are aggravated if the resetting of two or more interacting oscillators occurs at staggered times so that their periods of instability overlap. Such a situation might arise particularly with manual selectors that are independently settable for choosing the digits of different denominational orders.

OBJECTS OF THE INVENTION

The principal object of my present invention, therefore, is to provide an improved digital frequency generator which obviates the drawbacks discussed above.

A more particular object of this invention is to provide means in such a frequency generator for preventing transient fluctuations of its output frequency during changeovers involving the appearance of a denominational (e.g. decimal) carry.

SUMMARY OF THE INVENTION

My invention is generally applicable to a frequency generator comprising a group of electronically adjustable oscillators including two or more pilot oscillators and a final oscillator. The pilot oscillators produce respective denominational frequencies which can be modified with the aid of respective frequency dividers whose step-down ratios are digitally variable with the aid of associated selector means, as described in the aforementioned Hoffmann patent, each of these frequency dividers forming part of a respective phase-locking loop also including an associated phase discriminator which receives a variable frequency from that divider and a fixed comparison frequency from another source. The final oscillator has a frequency-adjusting input connected, via control means well known per se, to the several pilot oscillators whereby their selected denominational frequencies jointly determine the magnitude of the output frequency of the final oscillator. In the specific instance described hereinafter, the control means comprise a mixer with inputs connected to the final oscillator and a first pilot oscillator as well as a further phase discriminator with input connections extending—usually via a low-pass or band-pass filter—to the mixer output and—preferably by way of an additional frequency divider—to a second pilot oscillator, this phase discriminator working into the frequency-adjusting input of the final oscillator to complete a phase-locking loop therefor.

Pursuant to my present invention, the comparison frequencies fed to the phase discriminators are coherently derived from a common source of reference frequency, preferably through stages of a multistage divider chain connected to that source, so as to have an invariable phase relationship. A pulse generator connected to the reference-frequency source produces a train of unblocking pulses, each shorter than a cycle of the highest comparison frequency, which are separated by intervals longer than a half-cycle of the lowest comparison frequency. The unblocking pulses are applied to enabling inputs of memories inserted between the frequency dividers of the several pilot oscillators and the associated selector means, these memories storing setting commands which determine the step-down ratios of the dividers and therefore the operating frequencies of the associated pilot oscillators. A change in the contents of any of these memories, and thus in the step-down ratio of the corresponding frequency divider, can be carried out only in the presence of such an unblocking pulse.

Such a train of unblocking pulses can be conveniently generated by a coincidence circuit with inputs connected to the reference-frequency source, if that source emits a square wave, and to the outputs of successive binary stages of the aforementioned multistage divider chain driven by this square-wave generator. In order to insure that the unblocking pulses have a width substantially less than a half-cycle of the highest comparison frequency, there should be one or more stages at the entrance end of the chain between the source and the stage output carrying this highest frequency. The insertion of one or more stages downstream of the stage output carrying the lowest comparison frequency, thus at the exit end of the chain, establishes an inter-pulse interval which is a multiple of a cycle of the latter frequency.

According to a more particular feature of my invention, a timing device such as a monoflop is triggerable by the unblocking pulses to emit inhibiting pulses which are fed to the phase discriminator in the loop of the final oscillator and which disable this discriminator, or at least diminish its ability to alter the operating frequency of the final oscillator, for an off-normal period substantially shorter than the interval separating successive unblocking pulses but long enough to span the time of instability of the pilot oscillators resulting from changes in the step-down ratios of their associated frequency dividers. Though in principle such a complete or partial disablement of the final phase discriminator may be allowed to occur with every unblocking pulse, it will often be convenient to limit the emission of an inhibiting pulse to instances in which a predetermined switching criterion—such as simultaneous changes in the step-down ratios of several frequency dividers or the arrival of a setting command giving rise to a denominational carry—indicates an incipient major instability. This can be accomplished, according to still another feature of my invention, by the provision of a gating circuit in series with the monoflop, e.g. between the latter and the unblocking-pulse generator, this gating circuit being controlled by selection-responsive means to allow the emission of an inhibiting pulse only in the presence of such a switching criterion.

The several phase discriminators may include integrating circuitry to avoid abrupt changes in the operating frequencies and, in the case of the final oscillator, to bridge the period of disablement by an inhibiting pulse.

BRIEF DESCRIPTION OF THE DRAWING

The above and other features of my invention will now be described in detail with reference to the accompanying drawing in which:

FIG. 1 is a block diagram of a digitally settable frequency generator according to my invention;

FIGS. 2 and 3 are similar diagrams showing partial modifications of the system of FIG. 1;

FIG. 4 is a circuit diagram showing details of an integrating phase discriminator for the system of FIG. 2 or 3; and FIG. 5 is a block diagram showing another partial modification.

SPECIFIC DESCRIPTION

In FIG. 1 I have shown three oscillators of the voltage-controlled (VCO) type, namely a final oscillator 1, a first pilot oscillator 4 and a second pilot oscillator 8. Oscillator 1 produces on an output lead 2 a wave of frequency $f_o$ to be delivered to a nonillustrated load, e.g. an oscilloscope as shown in the above-mentioned Hoffmann patent. A mixer 3, included in a phase-locking loop for oscillator 1, receives the output frequency $f_o$ of that oscillator as well as a denominational frequency $f_1$ produced by oscillator 4. This mixer works via a low-pass filter 5 into an input of a phase comparator 61 forming part of a phase discriminator 6, its other input being connected by way of a frequency divider 7 to the output of oscillator 8 which produces a denominational frequency $f_2$ stepped down by the divider 7 in a ratio of t:1. Phase discriminator 6 also includes a frequency-difference detector 62 whose inputs are connected via an electronic switch 63, in parallel with those of phase comparator 61, to the outputs of filter 5 and divider 7. Through another low-pass filter 64, phase comparator 61 works into a frequency-adjusting input of oscillator 1 which also receives error signals, if any, from $\Delta f$ detector 62, in a manner known per se from the Hoffmann patent.

Oscillator 8 has a phase-locking loop which includes an adjustable frequency divider 11, with a step-down ratio of m:1, and a phase discriminator 9 also receiving a comparison frequency $f_a$ from a stage output of a binary divider chain with cascaded sections 13, 14 and 15 connected to a crystal-controlled square-wave generator 16 which produces a reference frequency $f_r$. The step-down ratio of divider 11 can be varied by setting commands fed in from a digital selector 19 by way of a memory 17 which stores these commands until the selector position is changed.

In an analogous manner, a phase-locking loop of oscillator 4 includes a frequency divider 12 of step-down ratio n:1, determined by setting commands stored in a memory 18 which can be loaded by a selector 20; divider 12 works into a phase discriminator 10 receiving a comparison frequency $f_b$ from another stage output of divider chain 13–15.

Memories 17 and 18 have enabling inputs connected to an output lead 51 of a coincidence circuit 21 having one input tied directly to the output of reference-frequency source 16 and other inputs tied to all the stage outputs of the binary divider chain 13–15; for the sake of simplicity, only the connections to the outputs of divider sections 13 and 14, emitting the comparison frequencies $f_a$ and $f_b$, have been illustrated along with a further connection to the output of the last section 15. These divider sections 13, 14 and 15 introduce respective step-down ratios a:1, b:1 and c:1; thus, $f_a = f_r/a$ and $f_b = f_r/ab$.

With this mode of connection, coincidence circuit 21 energizes its output 51 during a positive half-cycle of reference frequency $f_r$ coinciding with the beginning of a positive half-cycle of the frequency $f_c = f_r/abc$ available at the output of divider section 15. This energization constitutes a train of short unblocking pulses, of duration $1/2f_r$, recurring at intervals equal to $abc/f_r$. These unblocking pulses, concurrently applied to the enabling inputs of memories 17 and 18, permit the reloading of the memories by the selection signals fed to them which could be the same as those previously present at their writing inputs or could differ therefrom if the position of selectors 19 and/or 20 were changed in the interim. These selectors could be manually operated, independently of each other (and of similar selectors associated with other, nonillustrated stages of the frequency generator), or they could be driven by respective sawtooth-wave generators (cf. the aforementioned Hoffmann patent) operating as part of a decadic scanner 50 (FIG. 3) used for an automatic "wobbling" of output frequency $f_o$.

Output lead 51 of coincidence circuit 21 is also connected to a monoflop 22 for tripping same upon the occurrence of an unblocking pulse. Monoflop 22 has an off-normal period which outlasts that pulse and which produces an inhibiting pulse opening the switch 63 for a time somewhat longer than the duration of the unblocking pulse but considerably shorter than the recurrence period or cadence of these unblocking pulses. The opening of switch 63 diminishes the dynamic range of phase discriminator 6 inasmuch as phase comparator 61 can follow only to a limited extent the changes in its comparison frequency $f_2/t$ that could occur at this time. In this mode of restricted operation, therefore, the operating frequency $f_o$ of oscillator 1 (which could be of the order of tens of MHz) may be varied by only a few Hz, sufficient to eliminate noise and drift, whereby this oscillator is made insensitive to major frequency changes in the outputs of pilot oscillators 4 and 8. After a time sufficient for the restabilization of these pilot oscillators in the event of a frequency change, the disappearance of the inhibiting pulse in the output of monoflop 22 restores the full operating range of phase discriminator 6 so that final oscillator 1 now readjusts itself to the new values of denominational frequencies $f_1$ and/or $f_2$.

As will be readily understood, these denominational frequencies are given by $$f_1 = nf_b = \frac{nf_r}{ab}$$

and $$f_2 = mf_a = \frac{mf_r}{a}.$$

From these relationships the magnitude of output frequency $f_o$ of oscillator 1 is established as $$f_o = f_1 + \frac{f_2}{t} = \frac{f_r}{a}\left(\frac{m}{t} + \frac{n}{b}\right)$$

with $b=2$, for example, $t$ may be chosen equal to 20 so that a unit step of selector 20 will equal the full adjustment range (10 unit steps) of selector 19.

The parallel combination of phase comparator 61 and $\Delta f$ detector 62 is only an example of a phase discriminator switchable from a wider to a narrower dynamic range by an inhibiting pulse from monoflop 22.

In FIG. 2 I have shown a modified system in which the monoflop 22 is triggered by an enabling pulse from coincidence circuit 21 only if a certain switching criterion is satisfied, i.e. if there is a simultaneous change in the contents of memories 17 and 18 and therefore in the digits of the decadic columns represented by constants m and n. A voltage comparator 30, with input connections to the input and output leads of memory 17, detects a disparity between the contents of that memory and the setting of the associated selector 19 as will occur whenever the selector has been readjusted in the interval between successive unblocking pulses on lead 51. Analogously, a voltage comparator 31 is connected to the input and output leads of memory 18 for the detection of a disparity in their signal combinations. Upon sensing such a disparity, comparators 30 and 31 energize respective inputs of an AND gate 29 having a third input connected to output lead 51 of circuit 21. If two digits are being changed concurrently, AND gate 29 conducts in the presence of an unblocking pulse just before that pulse enables the reloading of memories 17 and 18 to equalize the signal voltages fed to comparators 30 and 31. Such conduction of gate 29 trips the monoflop 22 whose output is here shown connected to a blocking input of a phase (and frequency) discriminator 23 controlling the final oscillator 1; it will be understood that the variable-range phase discriminator 6 of FIG. 1 could be substituted for discriminator 23.

As shown in FIG. 4, discriminator 23 comprises a phase comparator 40 with output leads 41 and 42 connected via an electronic switch 43 to two other electronic switches 26 and 27 which are open when the phase-locking loop is in balance. Closure of switch 26, upon detection of a phase difference of a given sign between its input frequencies $f_o$-$f_1$ and $f_2/t$, connects a fixed positive voltage $+V$ to an input lead 28 of an integrating amplifier 25; closure of switch 27, upon detection of a phase difference of opposite sign, applies a fixed negative voltage $-V$ to lead 28. A capacitor 44, forming part of integrator 25, preserves any error signal accumulated thereon while the phase discriminator 23 is blocked by an inhibiting pulse on input 24 opening the switch 43.

In FIG. 3 I have shown the memory 17 provided with output leads $L_0$ and $L_9$ which are respectively energized when the setting command stored in that memory corresponds to a decimal value of "0" or "9". Memory 18 has similar output leads $L'_0$ and $L'_9$. Leads $L_0$ and $L_9$ extend by way of respective diodes 52, 53 to two capacitors 54 and 55 shunted by electronic switches 56 and 57. The ungrounded terminals of capacitors 54 and 55 are connected to respective inputs of an AND gate 58 whose output is tied to an input of an OR gate 33. Leads $L'_0$ and $L'_9$ are analogously connected via diodes 52', 53' to capacitors 54', 55', switches 56', 57' and an AND gate 58' whose output is connected to another input of OR gate 33. An AND gate 32, working into monoflop 22, has inputs connected to the output of OR gate 33 and to the lead 51. Switches 56, 57 and 56', 57' are controlled via a lead 59 by monoflop 22 and close in the presence of an inhibiting pulse from that monoflop.

When the scanner 50 driving the selectors 19 and 20 arrives at a position in which the digit represented by step-down ratio m or n changes from its decimal value "9" to its decimal value "0", or vice versa, capacitors 54, 55 or 54', 55' are both charged so that the AND gate 58 or 58' conducts and, via OR gate 33, energizes one of the inputs of AND gate 32. The emission of an unblocking pulse by coincidence circuit 21 energizes the other input of gate 32 so that monoflop 22 is triggered and briefly discharges the previously charged capacitors (though one of them, of course, will quickly recharge as soon as its shunt switch is reopened). Whereas the transition from "9" to "0" of selector 19 or from "0" to "9" of selector 20 in the course of a scanning sweep will give rise to a decimal carry within the illustrated frequency-generator stage, the opposite transitions will produce such carriers only in adjoining, nonillustrated stages.

In FIG. 5 I have shown a calculator 70 with inputs connected to a pair of manually settable digital selectors 119 and 120; such a calculator has been illustrated in commonly owned U.S. Pat. No. 4,020,425. Memories 17 and 18 are loaded by that calculator, upon being enabled by the energization of output lead 51 of coincidence circuit 21, as described above. An output lead 71 of calculator 70 is energized upon the occurrence of a switching criterion such as the appearance of a decimal carry, for example, to open an AND gate 72 to the passage of an unblocking pulse on lead 51 for the tripping of monoflop 22.

It will be understood that the final group of oscillators 1, 4, 8 may be cascaded with another oscillator group in an adjoining stage to which the output oscillation $f_o$ is fed as a comparison or heterodyning frequency.

I claim:

1. In a digitally settable frequency generator comprising selector means and a group of electronically adjustable oscillators including a final oscillator producing an output frequency and a plurality of pilot oscillators producing denominational frequencies jointly determining the magnitude of said output frequency, each of said pilot oscillators being provided with a phase-locking loop including a frequency divider with a step-down ratio digitally variable by said selector means and an associated phase discriminator with a first input connected to receive a variable frequency from said frequency divider and with a second input connected to receive one of a plurality of fixed comparison frequencies, said final oscillator being provided with control means connected between a frequency-adjusting input thereof and said pilot oscillators, the combination therewith of a reference-frequency source with output connection to the second inputs of the phase discriminators associated with said pilot oscillators for supplying same with coherent frequencies of different magnitudes constituting said comparison frequencies, pulse-generating means connected to said source for producing a train of unblocking pulses shorter than a cycle of the highest comparison frequency and separated by intervals longer than a half-cycle of the lowest comparison frequency, and memory means inserted between said selector means and said frequency dividers for storing setting commands determining the step-down ratios thereof, said memory means having enabling inputs connected to said pulse-generating means for preventing a change in the stored setting commands except in the presence of an unblocking pulse.

2. The combination defined in claim 1 wherein said output connections extend from stages of a multistage divider chain connected to said source, said divider chain having an entrance stage upstream of a stage output carrying the highest comparison frequency and an exit stage downstream of a stage output carrying the lowest comparison frequency, said pulse-generating means comprising a coincidence circuit with inputs connected to said source and to all the stage outputs of said divider chain.

3. The combination defined in claim 1 or 2 wherein said pilot oscillators include a first oscillator and a second oscillator, said control means comprising a mixer with inputs connected to said final oscillator and to said first oscillator, said mixer having an output circuit including filter means for passing only a frequency synthesized from said output frequency and from the denominational frequency generated by said first oscillator, and a further phase discriminator with input connections extending to said filter means and to said second oscillator and with an output connection to said frequency-adjusting input.

4. The combination defined in claim 3, further comprising timing means connected to said pulse-generating means and triggerable by said unblocking pulse to emit inhibiting pulses fed to said further phase discriminator for at least reducing the ability of the latter, over an off-normal period substantially shorter than said intervals, to alter the operating frequency of said final oscillator.

5. The combination defined in claim 4 wherein said further phase discriminator is deactivable by said inhibiting pulses and is provided with integrating circuitry for preserving, during said off-normal period, a control variable fed to said frequency-adjusting input.

6. The combination defined in claim 4, further comprising gating means in series with said timing means and selection-responsive means connected to said gating means for permitting the emission of an inhibiting pulse only in the presence of a predetermined switching criterion in the variation of said step-down ratio.

7. The combination defined in claim 6 wherein said selection-responsive means comprises sensing means connected to said memory means for allowing the emission of an inhibiting pulse only upon simultaneous changes in the step-down ratios of the frequency dividers associated with said first and second oscillators.

8. The combination defined in claim 6 wherein said selection-responsive means comprises respective output leads from the memory means associated with said first and second oscillators for allowing the emission of an inhibiting pulse only upon energization of at least one of said output leads in response to a setting command involving the generation of a denominational carry.

9. The combination defined in claim 6 wherein said selector means includes a calculator adapted to convert selection signals into said setting commands, said selection-responsive means comprising an output connection from said calculator energizable in response to a setting command involving the generation of a denominational carry.

10. The combination defined in claim 3 wherein the input connection of said further phase discriminator extending to said second oscillator includes an additional frequency divider.

* * * * *